US006700177B2

United States Patent
Yoshisato et al.

(10) Patent No.: US 6,700,177 B2
(45) Date of Patent: Mar. 2, 2004

(54) COMPACT, SURFACE-MOUNTING-TYPE, ELECTRONIC-CIRCUIT UNIT

(75) Inventors: Akiyuki Yoshisato, Fukushima-ken (JP); Kazuhiko Ueda, Fukushima-ken (JP); Hiroshi Sakuma, Fukushima-ken (JP); Akihiko Inoue, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 167 days.

(21) Appl. No.: 09/867,919

(22) Filed: May 29, 2001

(65) Prior Publication Data

US 2001/0048150 A1 Dec. 6, 2001

(30) Foreign Application Priority Data

May 30, 2000 (JP) .................................... 2000-160239
May 30, 2000 (JP) .................................... 2000-160247
May 30, 2000 (JP) .................................... 2000-160303

(51) Int. Cl.[7] .............................................. H01L 21/66
(52) U.S. Cl. ......................... 257/531; 257/532; 257/536
(58) Field of Search ................................. 257/531, 532, 257/536, E29.139, 924

(56) References Cited

U.S. PATENT DOCUMENTS

| 3,926,746 | A | * | 12/1975 | Hargis ......................... 205/128 |
| 4,426,773 | A | * | 1/1984 | Hargis ........................... 29/832 |
| 4,572,757 | A | * | 2/1986 | Spadafora .................... 156/252 |
| 4,681,656 | A | * | 7/1987 | Byrum .......................... 216/65 |
| 4,716,331 | A | * | 12/1987 | Higgins, Jr. ................. 310/330 |
| 4,965,526 | A | * | 10/1990 | Craft et al. ..................... 330/66 |
| 5,232,765 | A | * | 8/1993 | Yano et al. .................. 428/41.5 |
| 5,314,606 | A | * | 5/1994 | Irie et al. ..................... 205/128 |
| 5,371,029 | A | * | 12/1994 | Abdo et al. .................... 29/846 |
| 5,478,773 | A | * | 12/1995 | Dow et al. ................... 438/381 |
| 5,561,592 | A | * | 10/1996 | Furutani et al. ............. 361/707 |
| 5,784,261 | A | * | 7/1998 | Pedder ......................... 361/767 |
| 5,818,699 | A | * | 10/1998 | Fukuoka ...................... 361/760 |
| 5,832,600 | A | * | 11/1998 | Hashimoto .................... 29/841 |
| 5,880,011 | A | * | 3/1999 | Zablotny et al. ............. 438/462 |
| 5,923,224 | A | * | 7/1999 | Makino et al. ............... 333/1.1 |
| 6,228,676 | B1 | * | 5/2001 | Glenn et al. ................. 342/457 |
| 2001/0019865 | A1 | * | 9/2001 | Erdeljac et al. ............. 438/239 |
| 2002/0011658 | A1 | * | 1/2002 | Yoshisato et al. ........... 257/701 |

FOREIGN PATENT DOCUMENTS

| JP | Hei-08-046135 | 2/1996 |
| JP | Hei-10-070364 | 3/1998 |
| JP | Hei-11-067945 | 3/1999 |

* cited by examiner

Primary Examiner—David E Graybill
(74) Attorney, Agent, or Firm—Brinks Hofer Gilson & Lione

(57) ABSTRACT

In a surface-mounting-type electronic-circuit unit, circuit elements, including capacitors, resistors, and inductive devices, and electrically conductive patterns connected to the circuit elements are formed on an alumina board as thin films. Semiconductor bare chips for a diode and a transistor are wire-bonded to connection lands in electrically conductive patterns. And end-face electrodes connected to grounding electrodes, input electrodes, and output electrodes of electrically conductive patterns are formed at side faces of the alumina board.

8 Claims, 8 Drawing Sheets

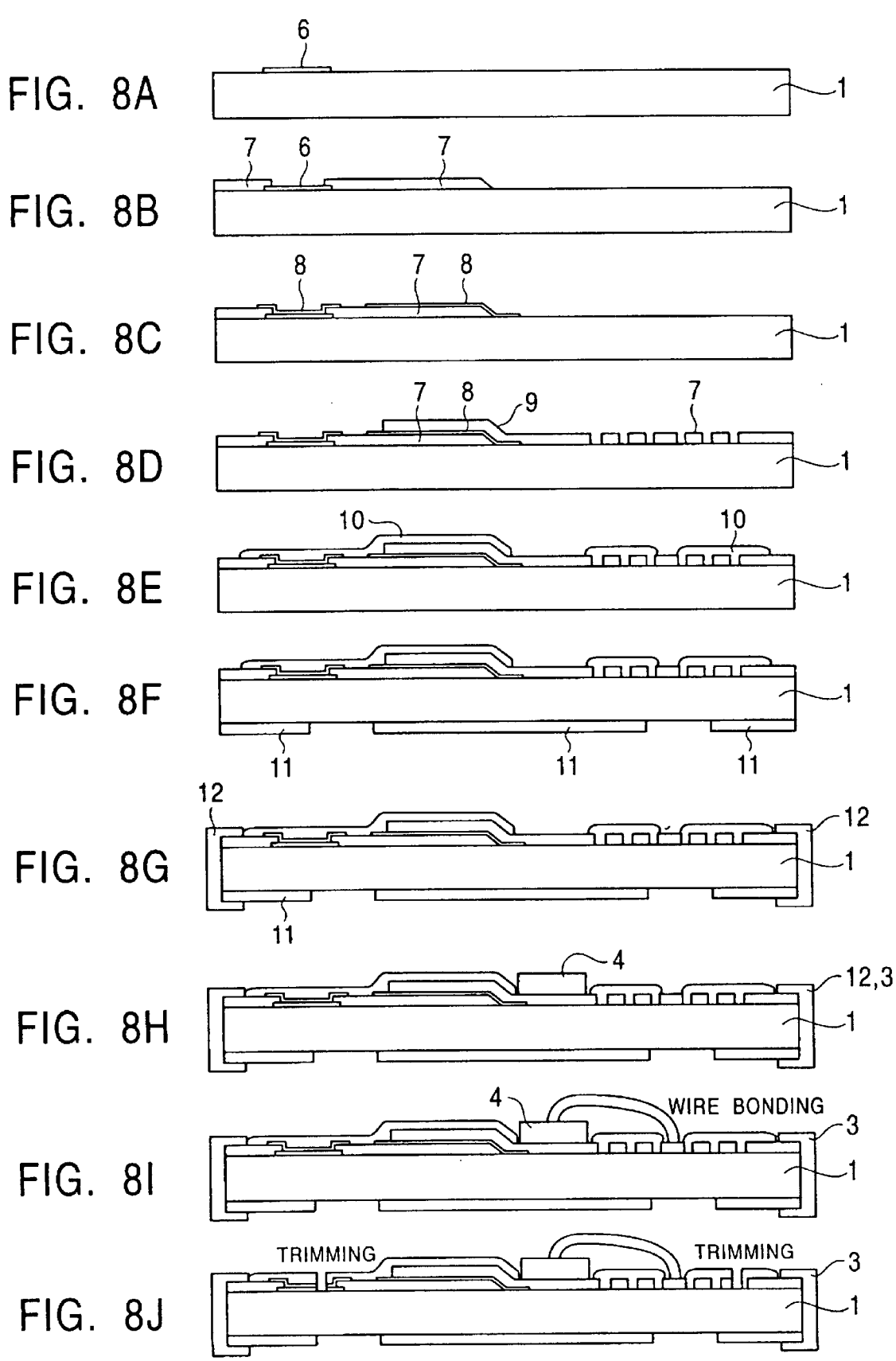

COMPACT, SURFACE-MOUNTING-TYPE, ELECTRONIC-CIRCUIT UNIT

BACKGROUND OF THE INVENTION

1. Field of the Invention

The present invention relates to surface-mounting-type electronic-circuit units.

2. Description of the Related Art

Surface-mounting-type electronic-circuit units are generally structured such that chip components such as resistors and capacitors, and semiconductor components such as transistors, are soldered to the soldered lands of electrically conductive patterns formed on a board. These circuit components are then typically covered with a shielding cover. End-face electrodes are provided at the side face of the board. The end-face electrodes are soldered to the soldered lands of a motherboard so as to surface-mount the electronic-circuit units on to the motherboard.

Such a board is obtained by dividing a large printed circuit board along a series of lattice-shaped division lines. The division lines are formed by a great number of through holes made in the large printed circuit board, and a plating layer, which serves as the end-face electrodes, is formed on each through hole. The large printed circuit board is then divided along division lines (which pass through the centers of the through holes). The end-face electrodes are formed at a side face of each printed circuit board generated by the division.

The technology for making compact circuit components, such as chip components and semiconductor components, has developed remarkably in recent years. For example, very compact chip resistors and chip capacitors having external dimensions of about 0.6 mm by 0.3 mm have recently become commercially available. When such very compact circuit components are mounted on a printed circuit board in a conventional electronic-circuit unit, as described above, with the distances between components being reduced to a minimum, the electronic-circuit unit can be made compact to some extent. However, there is a limitation for making circuit components more compact. In addition, when a great number of circuit components are mounted on a printed circuit board, short-circuiting of the soldered portions of the circuit components needs to be prevented. Therefore, there is also a limitation for reducing the distances between the components. These limitations prevent the size of the electronic-circuit units from being reduced further. In addition, since the end-face electrodes are formed by through holes, the limited mounting space on the printed circuit board is narrowed by the end-face electrodes. This also prevents the electronic-circuit units from being made more compact.

SUMMARY OF THE INVENTION

The present invention has been made in consideration of the above conventional technology. Accordingly, it is an object of the present invention to provide a compact, surface-mounting-type electronic-circuit unit, which overcomes the limitations of the conventional technology.

The foregoing object is achieved in one aspect of the present invention through the provision of an electronic-circuit unit including an alumina board; circuit elements including a capacitor, a resistor, and an inductive device, each formed as thin films on the alumina board; an electrically conductive pattern connected to a circuit element and formed as a thin film on the alumina board; a semiconductor bare chip mounted on the alumina board; and an end-face electrode connected to the electrically conductive pattern and formed on a side face of the alumina board, wherein the semiconductor bare chip is wire-bonded to the electrically conductive pattern.

The end-face electrode connected to the electrically conductive pattern may be formed as a thick film on a side face of the alumina board by the use of a low-temperature baked material.

With the above structure, since the circuit elements (including the capacitor, the resistor, and the inductive device) are formed with high precisely by using a thin-film technology, and the semiconductor bare chip is wire-bonded to form a semiconductor device, the required circuit components can be mounted on the alumina board in a high-density configuration to form a compact surface-mounting-type electronic-circuit unit.

It is preferred that Cu layers be formed on surfaces of the capacitor and the inductive device. This increases Q in a resonant circuit.

Since the end-face electrode is formed as a thick film by using a low-temperature baked material, it has a desired film thickness and is formed efficiently in terms of space. The circuit elements, which are formed as thin films; are prevented from being burned out during the baking process for the formation of the end-face electrode.

It is preferred that an Au plating layer be formed on the end-face electrode, which is formed as a thick film. This prevents Ag in the low-temperature baked material from depositing in solder (namely, prevents a silver-being-eaten phenomenon) when the end-face electrode is soldered to the soldered land of a motherboard.

It is preferred that the end-face electrode be formed as a thick film only at each of the two opposing sides of the alumina board. After a large printed circuit board is divided into strip-shaped pieces having a great number of alumina boards, end-face electrodes can then be formed as thick films on the side faces of the strip-shaped piece prior to dividing the strip-shaped piece into separate boards. This procedure is well suited to mass production.

The foregoing object is achieved in another aspect of the present invention through the provision of an electronic-circuit unit having circuit elements, including a capacitor, a resistor, and an inductive device, formed as thin films on an alumina board having a rectangular, plane shape; a semiconductor bare chip wire-bonded on the alumina board; grounding electrodes formed at the ends of two opposing side faces of the alumina board; and an input electrode and an output electrode formed away from the ends.

Since grounding electrodes are formed at the ends of two opposing side faces of the alumina board, and the input electrode and the output electrode are formed away from the ends, even when various adjustments and inspections are performed during a semi-production condition (namely, in a strip-shaped-piece condition) in which a great number of connected alumina boards are obtained by sub-dividing a large printed circuit board, the grounding electrodes eliminate adverse effects on the circuits of adjacent alumina boards.

It is preferred that a shielding cover be mounted to the alumina board so as to cover the circuit elements and the semiconductor bare chip, and that the shielding cover be soldered to the grounding electrodes. This increases a shielding effect.

BRIEF DESCRIPTION OF THE DRAWINGS

FIG. 8A to FIG. 8J are views showing steps in the manufacturing process of an electronic-circuit unit according to an embodiment of the present invention.

DESCRIPTION OF THE PREFERRED EMBODIMENTS

Figure 1:
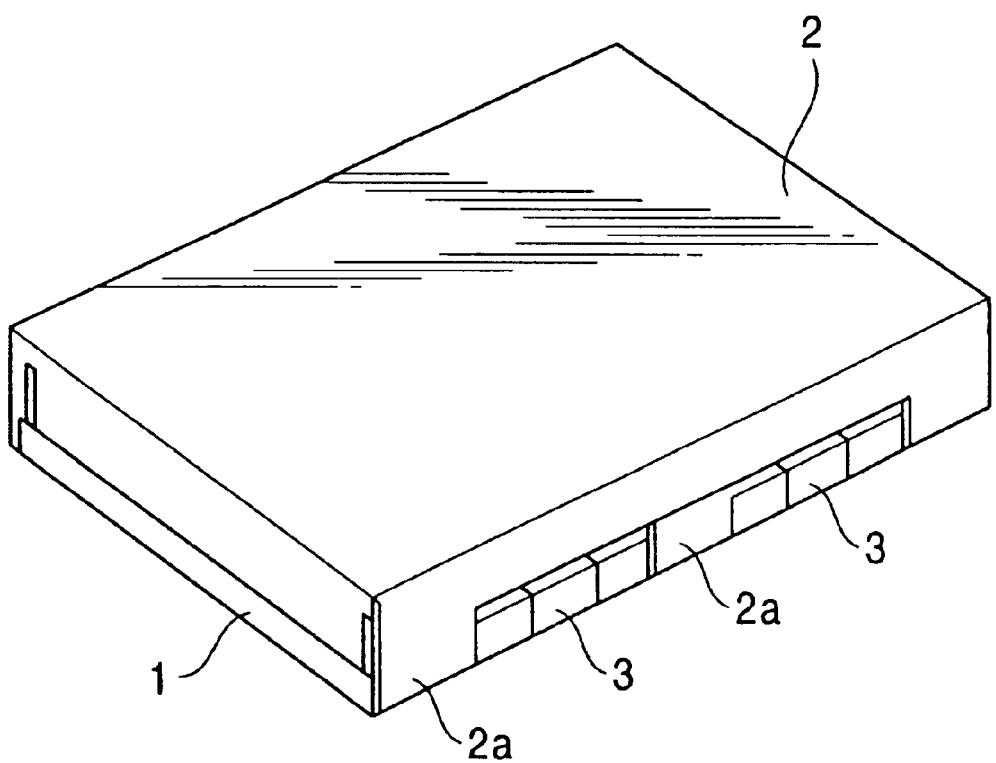
FIG. 1 is a perspective view of an electronic-circuit unit according to an embodiment of the present invention.
Figure 2:
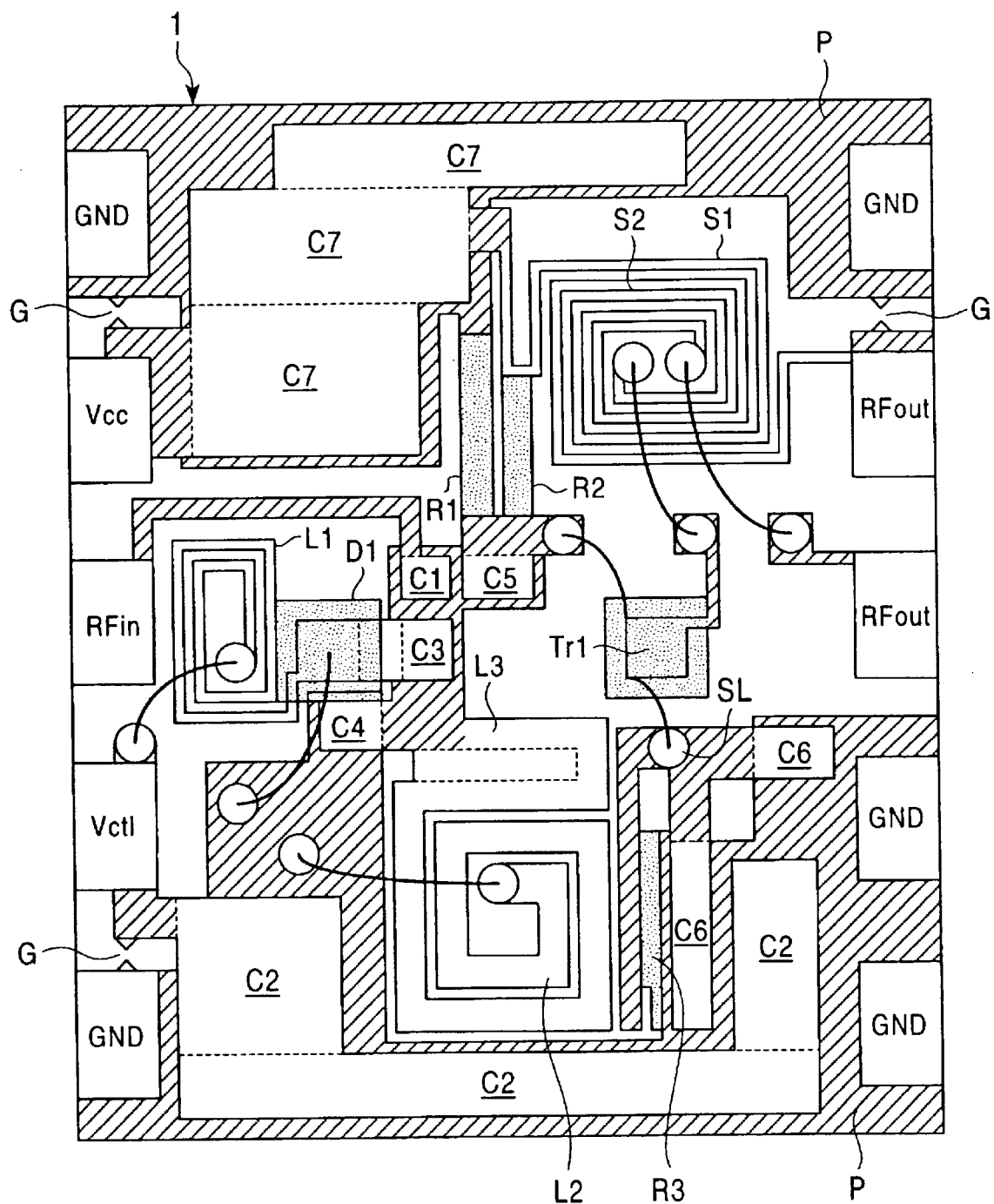
FIG. 2 is a plan of an alumina board, showing a circuit layout, according to an embodiment of the present invention.
Figure 3:
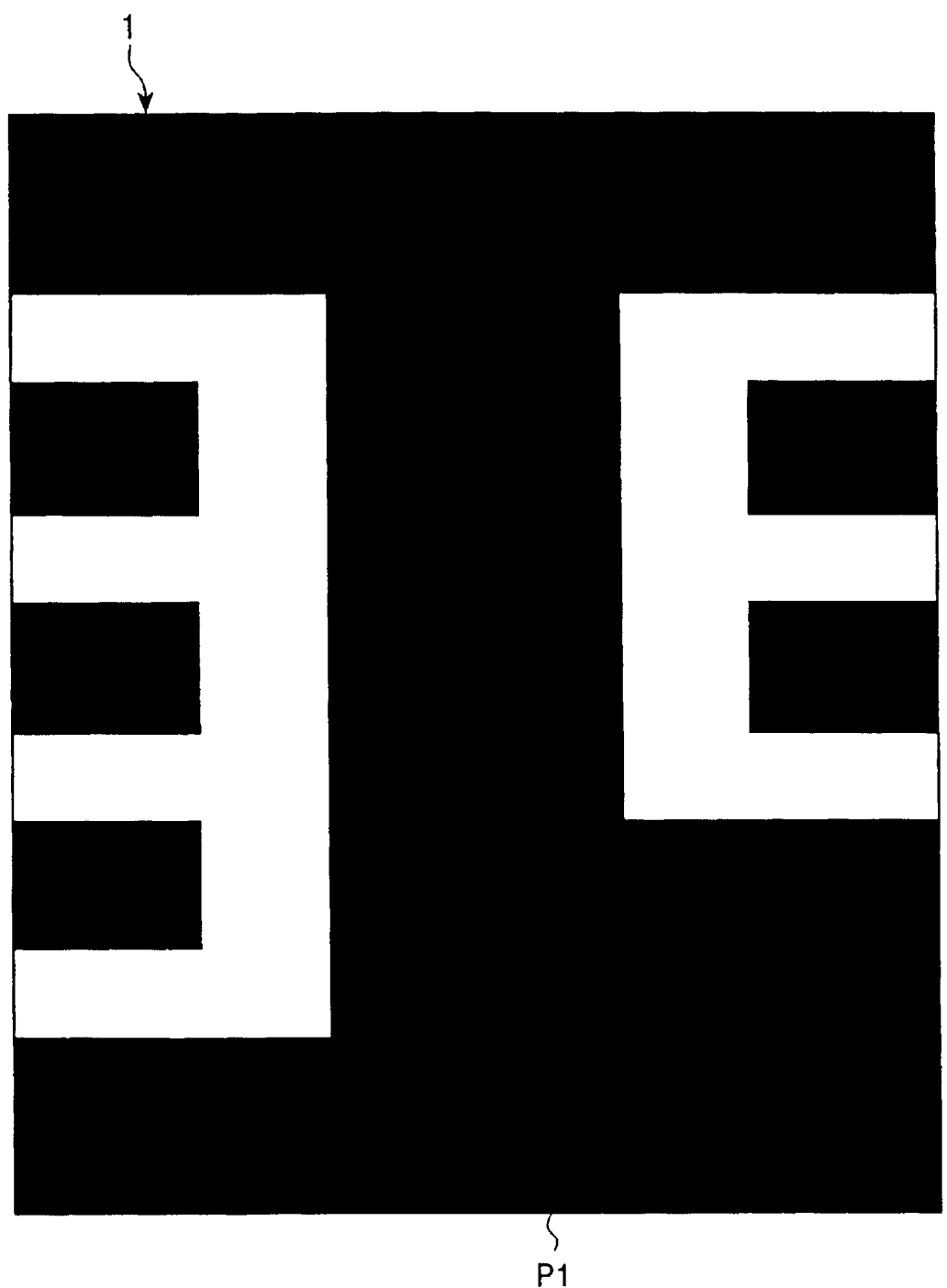
FIG. 3 is a bottom view of the alumina board shown in FIG. 2.
Figure 4:
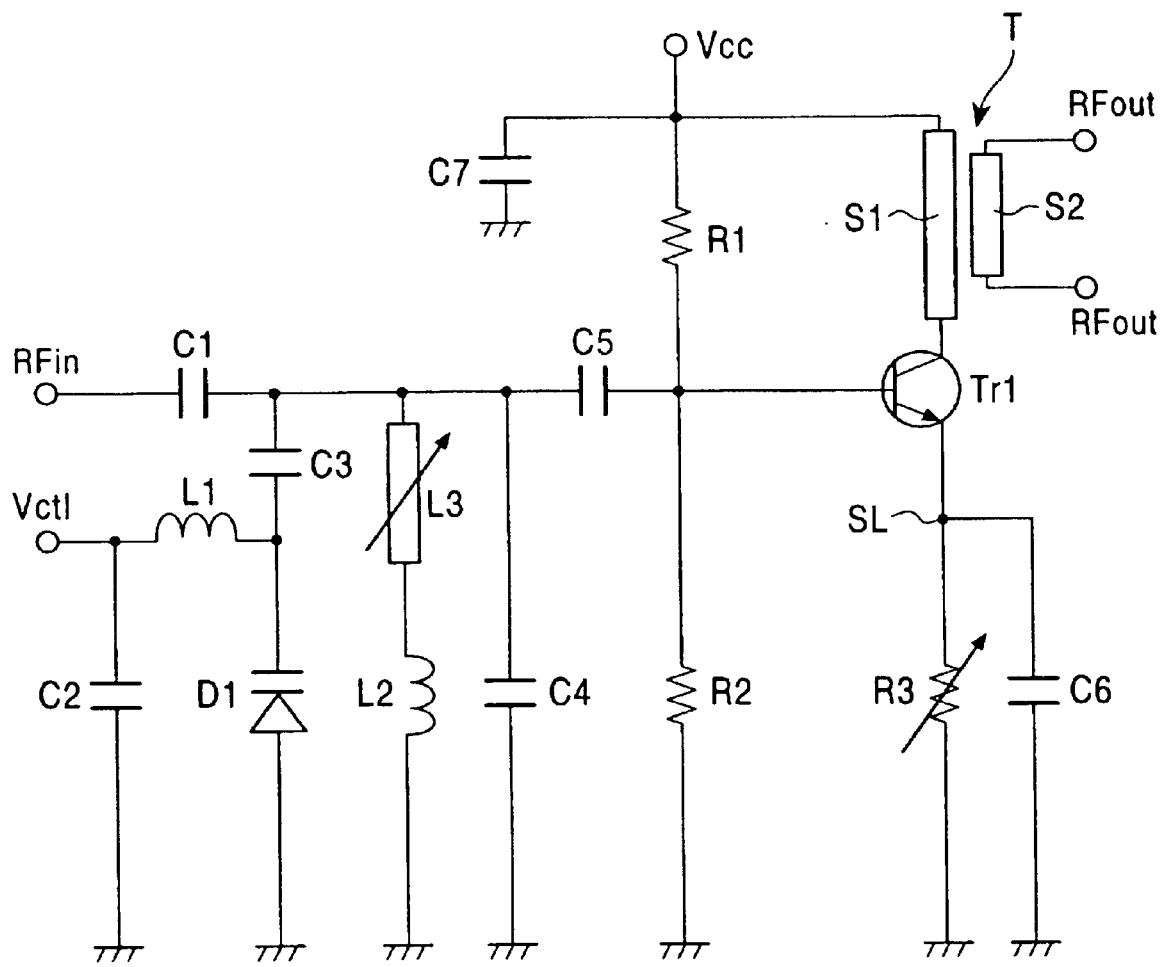
FIG. 4 is a view showing the circuit configuration for the circuit layout shown in FIG. 2.
Figure 5:
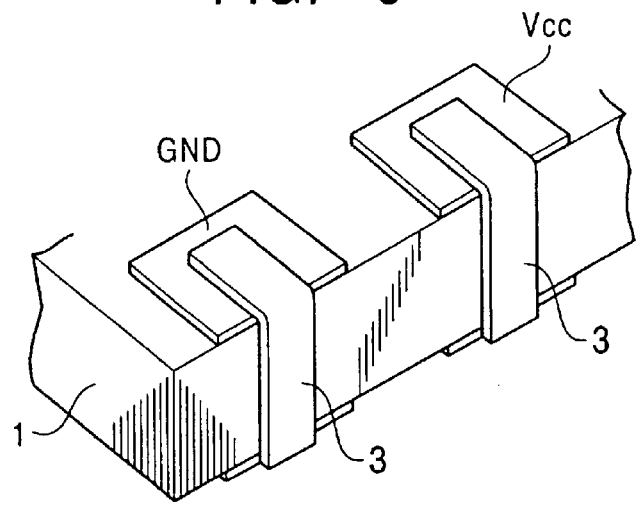
FIG. 5 is a perspective view of end-face electrodes of the alumina board shown in FIG. 2.
Figure 6:
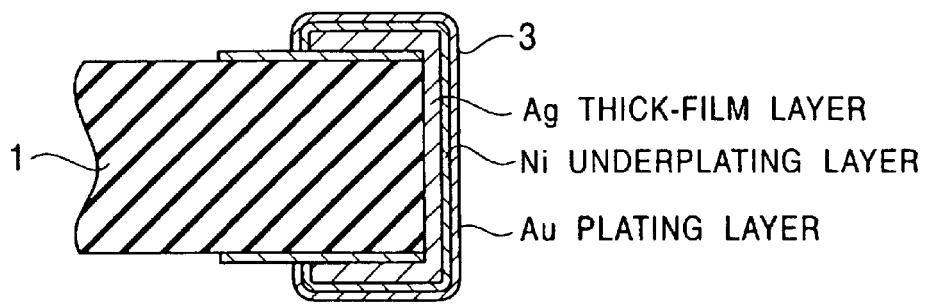
FIG. 6 is a cross-sectional view of the end-face electrode shown in FIG. 5.
Figure 7A:
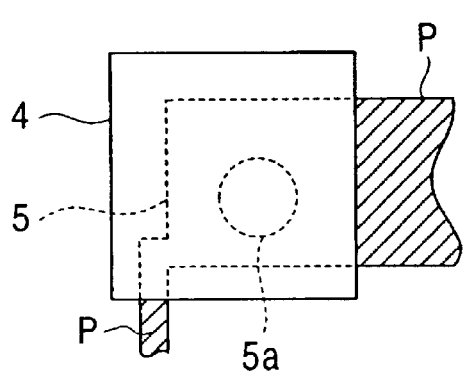
FIG. 7A and FIG. 7B are views showing relationships between a semiconductor bare chip and a connection land.
Figure 7B:
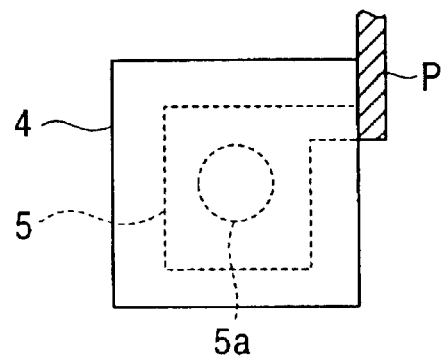

A first embodiment of the present invention will be described below by referring to the drawings, wherein: FIG. 1 is a perspective view of an electronic-circuit unit; FIG. 2 is a plan of an alumina board, showing a circuit layout; FIG. 3 is a bottom view of the alumina board; FIG. 4 is a circuit diagram; FIG. 5 is a perspective view of end-face electrodes; FIG. 6 is a cross-sectional view of an end-face electrode; FIG. 7A and FIG. 7B are views showing relationships between a semiconductor bare chip and a connecting land; and FIG. 8A to FIG. 8J are views showing the manufacturing processes of the electronic-circuit unit.

The present invention is described in connection with a frequency-tuning-type booster amplifier. The frequency-tuning-type booster amplifier is used together with an UHF tuner (not shown) in order to improve the receiving performance (especially, receiving sensitivity and disturbance-resistance characteristics) of a portable TV set, and has a function for selecting the TV signal having a desired frequency, for amplifying the selected TV signal, and for inputting it into the UHF tuner.

FIG. 1 shows the appearance of the frequency-tuning-type booster amplifier (electronic-circuit unit). As shown in the figure, the frequency-tuning-type booster amplifier is formed of an alumina board 1 on which circuit elements, described later, are mounted, and a shielding cover 2 mounted on the alumina board 1; and serves as an surface-mounting-type component to be soldered on to a motherboard (not shown). The alumina board 1 has a rectangular, plane shape, and is obtained by sub-dividing a large printed circuit board into strip-shaped pieces, and then further dividing the strip-shaped piece into separate boards. The shielding cover 2 is made by bending a metal plate in to a box shape. The circuit elements mounted on the alumina board 1 are covered by the shielding cover 2.

As shown in FIG. 2, the circuit elements and electrically conductive patterns for connecting them are provided on a surface of the alumina board 1. In addition, as shown in FIG. 3, electrically conductive patterns serving as rear electrodes are also formed on a rear surface of the alumina board 1. The frequency-tuning-type booster amplifier according to the present embodiment has a tuning circuit and an amplifier circuit for selecting and amplifying a TV signal, and includes the circuit structure shown in FIG. 4. The symbols used in the circuit diagram of FIG. 4 are also used to show the corresponding circuit elements in FIG. 2.

It should be understood that FIG. 4 merely shows an example circuit structure. The present invention can also be applied to electronic-circuit units having other circuit structures.

As shown in FIG. 4, the frequency-tuning-type booster amplifier includes capacitors C1 to C7, resistors R1 to R3, inductive devices L1 to L3, a diode D1, a transistor Tr1, and electrically conductive paths S1 and S2, all of which serve as components of the tuning circuit and the amplifier circuit. These components, and the electrically conductive patterns which connect the components, are disposed on a surface of the alumina board 1. The electrically conductive patterns are made, for example, from Cr or Cu formed by using a thin-film technology, such as sputtering, and are illustrated in FIG. 2 by hatching and the symbol P.

The circuit structure of the frequency-tuning-type booster amplifier will be briefly described below. To select and amplify the TV signal having a desired frequency, the booster amplifier is formed of the tuning circuit having the inductive devices L2 and L3, the capacitors C3 and C4, and the diode D1. The amplifier circuit is formed of the transistor Tr1, its surrounding circuit devices (the resistors R1 to R3, and the capacitor C6), and a unbalance/balance transforming device T. TV signals having a plurality of frequencies are input into the tuning circuit through the capacitor C1. Since the tuning frequency (resonant frequency) of the tuning circuit is changed by controlling a voltage (Vct1) applied to the cathode of the diode D1, when the tuning frequency is made equal to the frequency of a desired TV signal, only the desired TV signal is selected and is input into the base of the transistor Tr1 of the amplifier circuit through the capacitor C5. A bias voltage is applied to the base of the transistor Tr1 by base-bias voltage-dividing resistors R1 and R2. The collector current (which nearly equals the emitter current) of the transistor Tr1 is specified by the resistance of the emitter resistor R3. The TV signal amplified by the transistor Tr1 is output from the collector. The collector is connected to the unbalance/balance transforming device T. The unbalance/balance transforming device T is an inductive device formed of a pair of electrically conductive paths S1 and S2 coupled with each other. A balanced TV signal is output across both ends of the electrically conductive path S2, and input into the UHF tuner.

As shown in FIG. 2, grounding electrodes (GND), input electrodes (Vcc, Vct1, RFin), and output electrodes (RFout) are formed at end portions of the alumina board 1. These electrodes are part of the electrically conductive patterns P. The grounding electrodes, the input electrodes, and the output electrodes are formed along the two long opposing sides of the rectangular-shaped alumina board 1. No electrode is formed at the two opposing short sides of the alumina board 1. More specifically, GND electrodes are formed at both ends (corners) of one long side of the alumina board 1, and a Vcc electrode, an RFin electrode, and a Vct1 electrode are formed between the GND electrodes. GND electrodes are also formed at three locations, both ends and a portion close to one of the ends, along the other long side of the alumina board 1, and two RFout electrodes are formed between these GND electrodes. As will be described later, the two long sides of the alumina board 1 correspond to division lines along which the large printed circuit board is sub-divided into strip-shaped pieces, and the two short sides of the alumina board 1 correspond to division lines along which a strip-shaped piece is further divided into separate boards.

As shown in FIG. 3, electrically conductive patterns P1 (rear-surface electrodes) are formed on the rear surface of the alumina board 1, and are placed so as to be opposite the grounding electrodes (GND), the input electrodes (Vcc, Vct1, RFin), and the output electrodes (RFout). The patterns and the electrodes are electrically connected through end-face electrodes 3 as shown in FIG. 5 and FIG. 6. The end-face electrodes 3 are formed by sequentially laminating an Ag thick-film layer, an N1 underplating layer, and an Au plating layer in that order. The lowest layer, the Ag thick-film layer, is made from a low-temperature baked material produced by forming a thick film of Ag, paste not including a glass component, and by then baking the paste at about 200° C. The intermediate layer, the Ni underplating layer, facilitates the application of the Au plating layer. The highest layer, the Au plating layer, prevents the Ag in the lowest layer from depositing in solder when the end-face electrodes 3 are soldered to the soldered lands of the motherboard (not shown).

As shown in FIG. 1, legs 2a are bent and formed at side surfaces of the shielding cover 2, and are soldered to end-face electrodes 3, thereby electrically connecting the shield cover 2 to the grounding electrodes (GND) to form an assembled electronic-circuit unit in which the shielding cover 2 is mounted to the alumina board 1. The shielding cover 2 is grounded at the four corners of the alumina board 1.

In the circuit devices described above, the capacitors C1 to C7 are formed by laminating lower electrodes, dielectric films such as $SiO_2$, and upper electrodes together. They are formed as thin films by sputtering or other methods. Cu layers are formed on the surfaces of the upper layers to increase Q of the resonant circuit. The lower electrodes and the upper electrodes of the capacitors C1 to C7 are connected to electrically conductive patterns P. As shown in FIG. 2, discharging proximity sections (air gaps) G are provided on the electrically conductive patterns P between the capacitor C7 and the Vcc electrode, between the capacitor C7 and the RFout electrode, and between the capacitor C2 and the Vct1 electrode. These proximity sections G each are formed of a pair of protrusions on electrically conductive patterns P that are parallel to and facing each other. The tips of the protrusions oppose each other with a predetermined gap disposed therebetween. In this case, since a thin-film technology provides high dimensional precision for the electrically conductive patterns P and the GND electrodes, the gap distances of the proximity sections G can be narrowed. Discharging is therefore allowed at lower voltages. Among the capacitors C1 to C7, the capacitors C1 and C3 to C5 have simple rectangular shapes. The capacitors C2 and C7 have different shapes in which two or more rectangular shapes are combined. More specifically, the capacitor C2 has a U-like shape in which two rectangles protrude from a side of one rectangle. The capacitor C7 has a shape in which three rectangles are connected and shifted in a long-side direction. The capacitors C2 and C7 are grounding capacitors that require relatively large capacitances. When the grounding capacitors C2 and C7 have such shapes, the limited space on the alumina board 1 is effectively used, and capacitors having desired capacitances can be mounted at higher densities.

Among the capacitors C1 to C7, the capacitor C6 is formed of two grounding capacitors having different sizes, which are connected in parallel through a pair of electrically conductive patterns separated from each other. More specifically, as shown in FIG. 2, one electrode section of each of both grounding capacitors is connected to a grounding electrically conductive pattern P connected to GND electrodes, and the other electrode section is connected to a connection land SL of the transistor Tr1 through one of two electrically conductive patterns P separated from each other. Since it is clear from FIG. 4 that the capacitor C6 is formed between the emitter of the transistor Tr1 and the ground, and that the emitter electrode of the transistor Tr1 is wire-bonded to the connection land SL, the capacitance of the capacitor C6 is specified by the two grounding capacitors connected in parallel through electrically conductive patterns P that are separated from each other. Therefore, the inductance of the electrically conductive pattern P disposed from the emitter electrode of the transistor Tr1 to the ground through the capacitor C6 is reduced, and the grounding effect for the connection land SL is enhanced due to the grounding capacitors. In addition, since the frequency of a parasitic oscillation caused by each grounding capacitor and each electrically conductive pattern P increases, when the frequency is set so as to be equal to or higher than the operating-point frequency of the transistor Tr1, parasitic oscillations are eliminated.

The resistors R1 to R3 are made, for example, from resistor films such as $TaSiO_2$ by using a thin-film technology such as sputtering. Dielectric films such as $SiO_2$ are formed on the surfaces thereof as required. As shown in FIG. 2, the resistors R1 and R2 are formed in parallel as thin films at positions close to each other on the alumina board 1. The resistor R3 is formed as a thin film at a position distant from those of the resistors R1 and R2. Since the resistors R1 and R2 are formed at close positions, even if the resistance of the resistor R1 and that of the resistor R2 are shifted from desired values, the rate of dispersion is set equal between both resistors R1 and R2. It is clear from FIG. 4 that the resistors R1 and R2 are base-bias voltage-dividing resistors for the transistor Tr1. A voltage of $Vcc \times R1/(R1+R2)$ is applied to the base of the transistor Tr1. Since the rate of dispersion is always set equal between the resistors R1 and R2, which serve as base-bias voltage-dividing resistors, trimming is not required for the resistances of the resistors R1 and R2. The resistor R3 serves as the emitter resistance of the transistor Tr1. A current flows from the Vcc electrode through the collector and the emitter of the transistor Tr1, and further through the resistor R3 to the ground. Since the resistor R3, serving as the emitter resistor, most contributes to the degree of amplification of the transistor Tr1 among the resistors R1 to R3, only the resistor R3 is trimmed so as to make the current constant for output adjustment.

Figure 9:
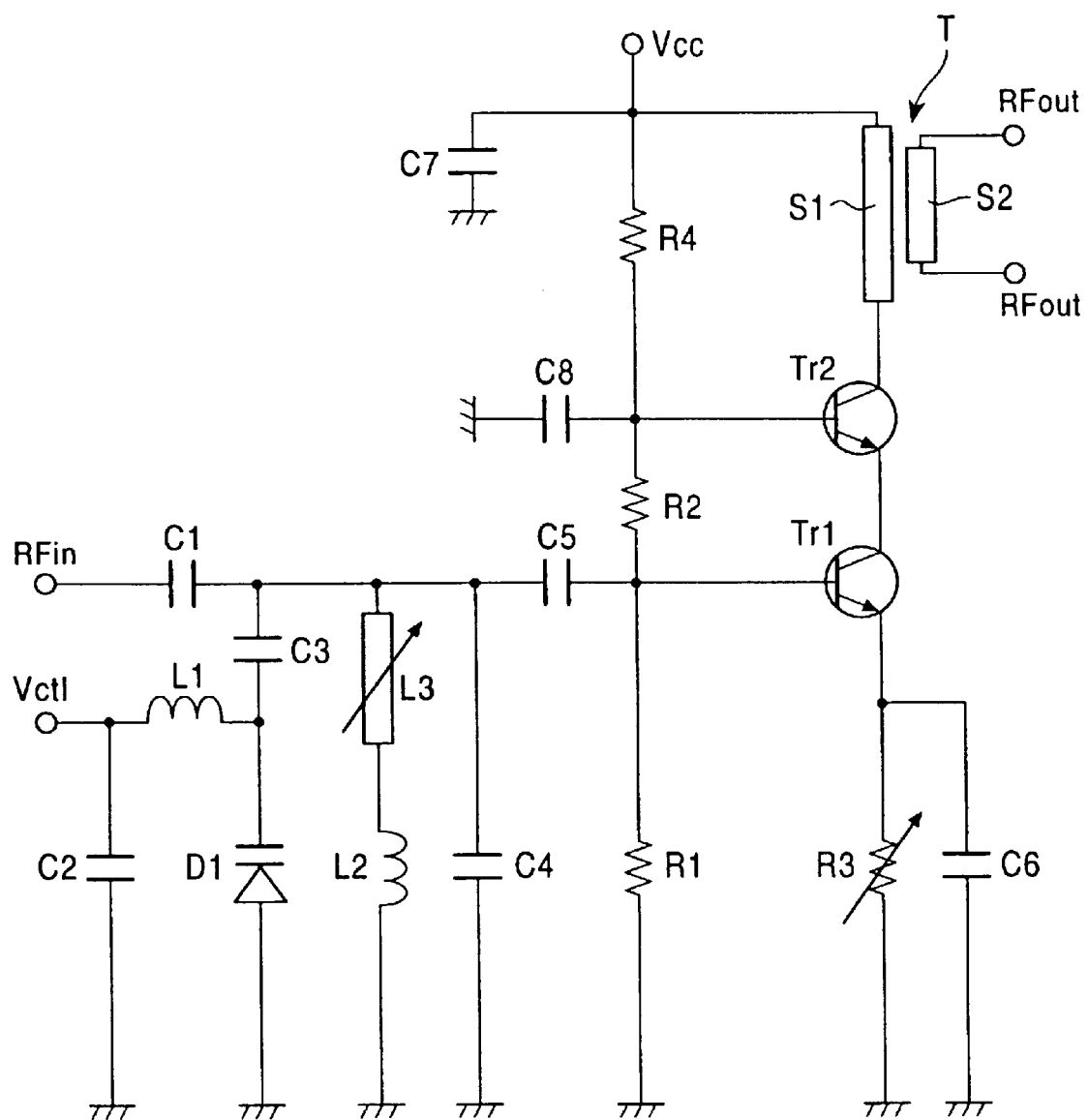
FIG. 9 is a view showing another circuit configuration.

In a case in which a transistor Tr2 is connected in series to the transistor Tr1, as shown in FIG. 9, with resistors R1, R2, and R4 serving as base-bias voltage-dividing resistors for both transistors Tr1 and Tr2 formed as thin films at positions close to each other on the alumina board 1, it is unnecessary to trim the resistors R1, R2, and R4 for their resistances. Therefore, in this case, currents flowing through both transistors Tr1 and Tr2 are specified by likewise trimming only the resistor R3 serving as the emitter resistor.

The inductive devices L1 to L3 and the electrically conductive paths S1 and S2 are made from Cr or Cu formed by using a thin-film technology, such as sputtering, and are connected to electrically conductive patterns P. Cu layers are formed on the surfaces of the inductive devices L1 to L3 to increase Q in the resonant circuit. The inductive devices L1 and L2 are formed in rectangular spiral shapes, and are wire bonded to the Vct1 electrode and a grounding electrically conductive pattern P at ends. The inductive device L2 is used for specifying a rough resonant frequency, and the inductive device L3 is connected to the other end of the inductive device L2. The inductive device L3 is used for adjusting the resonant frequency. As indicated by a dotted line in FIG. 2, when the inductive device L3 is trimmed, the number of turns of the inductive device L2 is increased to adjust the resonant frequency. In this case, when the width of the conductor of the trimmed inductive device L3 is made equal to that of the conductor of the inductive device L2, which is used for setting the resonant frequency, the inductive device L2 and the inductive device L3 have the same characteristic impedance.

Figure 10:
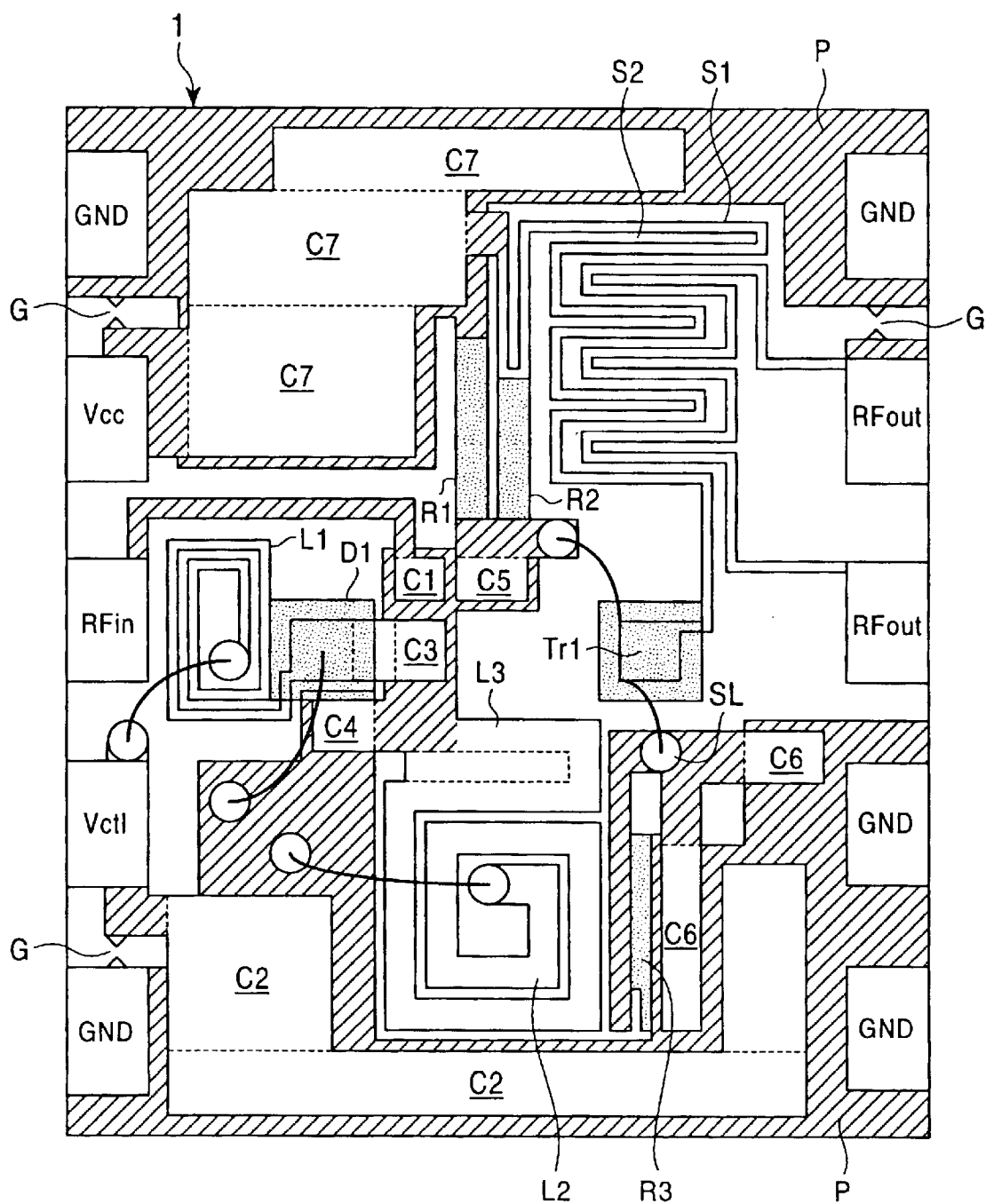
FIG. 10 is a plan of an alumina board having a circuit layout in accordance with the circuit configuration shown in FIG. 9.

As described above, the unbalance/balance transforming device T is an inductive device formed of a pair of electrically conductive paths S1 and S2 coupled with each other, and the electrically conductive paths S1 and S2 are formed on the alumina board 1 as thin films. These electrically conductive paths S1 and S2 are formed in a spiral shape so that they oppose each other through a predetermined gap. Both ends of the electrically conductive path S1 are connected to the collector electrode of the transistor Tr1 and an electrically conductive pattern P connected to the capacitor C7. Both ends of the electrically conductive path S2 are connected to a pair of RFout electrodes. In this case, since the dimensional precision of the electrically conductive paths S1 and S2, which are formed as thin films, is high, the gap between both electrically conductive paths S1 and S2 is narrowed to ensure a desired coupling degree. A compact unbalance/balance transforming device T can therefore be disposed in a limited space on the alumina board 1. As shown in FIG. 10, a pair of electrically conductive paths S1 and S2 opposing each other through a predetermined gap may also be formed in a jig-jag manner on the alumina board 1.

The diode D1 and the transistor Tr1 are formed by mounting semiconductor bare chips on connection lands of electrically conductive patterns P formed on the alumina board 1 as thin films and by wire-bonding them to electrically conductive patterns P. As shown in FIG. 2, the semiconductor bare chip of the diode D1 has a rectangular shape. One electrode disposed at a lower surface thereof is secured to a connection land by using electrically conductive adhesive, such as solder cream or electrically conductive paste, and the other electrode disposed at an upper surface of the semiconductor bare chip is wire-bonded to a predetermined portion of an electrically conductive pattern P. The semiconductor bare chip of the transistor Tr1 also has a rectangular shape. A collector electrode disposed at a lower surface thereof is secured to a connection land by using electrically conductive adhesive, and a base electrode and an emitter electrode are wire-bonded to predetermined portions of electrically conductive patterns P. Like the end-face electrodes 3 described above, these connection lands are also sequentially covered by Ni underplating layers and Au plating layers.

As shown in FIG. 7A and FIG. 7B, a connection land 5 has a smaller area than a semiconductor bare chip 4. With this structure, a space for accommodating extra electrically conductive adhesive is made below the semiconductor bare chip 4. Therefore, extra electrically conductive adhesive is prevented from sticking out from the semiconductor bare chip 4, which can cause a short-circuit with surrounding electrically conductive patterns P. In addition, an opening 5a is provided inside the connection land 5 to accommodate extra electrically conductive adhesive to positively prevent the adhesive from sticking out from the semiconductor bare chip 4.

The manufacturing processes of the electronic-circuit unit configured as described above will be described below with reference to FIGS. 8A through 8J.

As shown in FIG. 8A, $TaSiO_2$ or an equivalent is applied to the whole surface of the alumina board 1 by sputtering, and then it is etched so as to have a desired shape to form a resistor film 6 corresponding to the resistors R1 to R3. Then, as shown in FIG. 8B, Cr or Cu is applied by sputtering on to the resistor film 6, and it is then etched so as to have a desired shape to form lower electrodes 7. Next, as shown in FIG. 8C, $SiO_2$ or an equivalent is applied to the lower electrodes 7 by sputtering, and it is then etched so as to have a desired shape to form dielectric films 8. Then, as shown in FIG. 8D, Cr or Cu is applied by sputtering on the dielectric films 8, and it is then etched so as to have a desired shape to form upper electrodes 9.

As a result, the portions corresponding to the electrically conductive patterns P, the inductive devices L1 to L3, and the electrically conductive paths S1 and S2 are formed by lower electrodes 7 and upper electrodes 9, and those corresponding to the capacitors C1 to C7 are formed by the laminated members of lower electrodes 7, dielectric films 8, and upper electrodes 9. Then, Cu layers are formed on the portions corresponding to the inductive devices L1 to L3, the electrically conductive paths S1 and S2, and the capacitors C1 to C7 by plating or by a thin-film technology.

Next, as shown in FIG. 8E, protection films 10 are formed on the portions other than the electrically conductive patterns P. Then, as shown in FIG. 8F, Cu or Cr is applied to the whole rear surface of the alumina board 1 by sputtering, and then it is etched so as to have a desired shape to form rear-surface electrodes 11 corresponding to the electrically conductive patterns P1 on the rear surface.

The processes shown in FIG. 8A to FIG. 8F described above, are applied to a large printed circuit board made from alumina, in which division grooves extending horizontally and vertically in a lattice manner are engraved. Processes shown in FIG. 8G to FIG. 8J, described next, are applied to strip-shaped pieces obtained by dividing the large printed circuit board along division grooves in one direction.

After the large printed circuit board is divided into strip-shaped pieces, Ag layers 12 are formed as thick films at both end faces of each alumina board 1, as shown in FIG. 8G, to electrically connect the grounding electrodes (GND), the input electrodes (Vcc, Vct1, RFin), and the output electrodes (RFout) to the corresponding-type electrodes, and form the electrically conductive patterns P and P1 on both surfaces of the alumina board 1. The Ag layers 12 correspond to the Ag thick-film layers of the end-face electrodes 3, described above, and are made from a low-temperature baked material formed of Ag paste not including a glass component. As described above, the process for forming the Ag thick-film layers 12 is applied to one strip-shaped piece. If a plurality of strip-shaped pieces are stacked with slight gaps being disposed between them, the Ag layers 12 can be formed at the same time on the plurality of strip-shaped pieces.

Next, Ni underplating layers and Au layers are plated in that order on surfaces of the Ag layers 12 and on those connection lands on which semiconductor bare chips are to be mounted. Then, as shown in FIG. 8H, the semiconductor bare chips for the diode D1 and the transistor Tr1 are secured to the connection lands with the use of electrically conductive adhesive, such as solder cream or electrically conductive paste. In this case, as described above, since the connection lands have smaller areas than the lower surfaces of the semiconductor bare chips, the electrically conductive adhesive is prevented from sticking out from the semiconductor bare chips. This ensures that the electrically conductive adhesive is not short-circuited with any electrically conductive patterns P formed around the semiconductor bare chips.

Next, as shown in FIG. 8I, each semiconductor bare chip is wire-bonded to predetermined portions of electrically conductive patterns P. Then, as shown in FIG. 8J, the resistor R3, serving as an emitter resistor, is trimmed to adjust the output, and the inductive device L3, serving as an adjustment electrically conductive pattern, is trimmed to adjust the resonant frequency. In this case, the resonant frequency is adjusted in a state in which each alumina board 1 has not yet been separately formed, namely, while still in a strip-shaped piece. Since grounding electrodes (GND) are provided at the corners of each alumina board 1, grounding electrodes (GND) are always disposed between the input electrodes (Vcc, Vct1, RFin) and the output electrodes (RFout) of one alumina board 1, and those of an adjacent alumina printed circuit board 1, the adjustment of the resonant frequency is prevented from adversely affecting the circuit of an adjacent alumina board 1.

Then, the shielding cover 2 is mounted to each alumina board 1 in a strip-shaped piece, the legs 2a of the shielding cover 2 are soldered to end-face electrodes 3 electrically connecting to grounding electrodes (GND), and the strip-shaped piece is further divided along the transverse division grooves to obtain the electronic-circuit unit as shown in FIG. 1.

According to the above embodiment of the electronic-circuit unit configured as described above, since the circuit elements, such as the capacitors C1 to C7, the resistors R1 to R3, the inductive devices L1 to L3, and the electrically conductive paths S1 and S2, and the electrically conductive patterns P connected to the circuit elements are formed on the alumina board 1 as thin films; the semiconductor bare chips for the diode D1 and the transistor Tr1 are wire-bonded on the alumina board 1; and the end-face electrodes 3 connected to the grounding electrodes, the input electrodes, and the output electrodes of electrically conductive patterns are formed at side faces of the alumina board 1, the required circuit elements are mounted on the alumina board 1 in a high-density condition by the use of a thin-film technology and wire bonding of the semiconductor chips to form a compact surface-mounting-type electronic-circuit unit. In addition, since Cu layers are formed on surfaces of the capacitors C1 to C7, the inductive devices L1 to L3, and the electrically conductive paths S1 and S2, which are formed as thin films, the resonant circuit has an increased Q.

Since the end-face electrodes 3 are formed as thick films by a low-temperature baked material, they have a desired film thickness and are formed efficiently in terms of space. In addition, the circuit elements, such as capacitors and resistors, which are formed as thin films, are prevented from being burned out during the baking process for forming the end-face electrodes 3. Further, since the Au plating layers are formed in the end-face electrodes 3 which have been formed as thick films, Ag in the low-temperature baked material is prevented from depositing in solder (namely, a silver-being-eaten phenomenon is prevented) when the end-face electrodes are soldered to soldered lands of the motherboard. Furthermore, since the end-face electrodes 3 are formed as thick films only at two opposing sides of the alumina board 1, after a large printed circuit board is divided into strip-shaped pieces, end-face electrodes 3 can be formed as thick films at the same time on mulitple strip-shaped pieces of the alumina boards 1 simultaneously, thereby facilitating mass production.

Since grounding electrodes (GND) are formed at the ends of two opposing sides of the alumina board 1, and the input electrodes (Vcc, Vct1, RFin) and the output electrodes (RFout) are disposed between the grounding electrodes, even when various adjustments and inspections are performed during a semi-production condition, namely, in a strip-shaped-piece condition (which is obtained by dividing a large printed circuit board), the adjustments and inspections give no adverse effects on the circuits of adjacent alumina boards in the strip-shaped piece. Various adjustments are therefore easily performed. In addition, since the legs 2a of the shielding cover 2 are soldered to the grounding electrodes disposed at the four corners of the alumina board 1, the electronic-circuit unit has a high shielding effect.

Since the circuit elements, including the capacitors, the resistors, the inductive devices, and the electrically conductive patterns connected to the circuit elements are formed on the alumina board as thin films; the semiconductor bare chips mounted on the alumina board are wire-bonded to electrically conductive patterns; and the end-face electrodes connected to electrically conductive patterns are formed at side faces of the alumina board as thick films by the use of a low-temperature baked material, the required circuit elements are mounted on the alumina board in a high-density condition to form a compact surface-mounting-type electronic-circuit unit. In addition, since the end-face electrodes are formed as thick films by the use of a low-temperature baked material, they have a desired film thickness and are formed efficiently in terms of space. The circuit elements, which are formed as thin films, are prevented from being burned out during the baking process for forming the end-face electrodes.

Since grounding electrodes are formed at the ends of two sides facing each other of the alumina board, and the input electrodes and the output electrodes are disposed away from the ends, the required circuit elements are mounted on the alumina board in a high-density condition to form the compact surface-mounting-type electronic-circuit unit. In addition, even when various adjustments and inspections are performed during a semi-production condition, namely, in a strip-shaped-piece condition (which is obtained by dividing a large printed circuit board), the grounding electrodes eliminate adverse effects on the circuits of adjacent alumina boards.

What is claimed is:

1. An electronic-circuit unit comprising:
    an alumina board having a planar surface and at least one side face formed perpendicular to the surface;
    circuit elements, comprising a capacitor, a resistor, and an inductive device, formed as thin films on the surface of the alumina board;
    an electrically conductive pattern connected to a circuit element, formed as a thin film on the surface of the alumina board;
    a semiconductor bare chip mounted on the surface of the alumina board; and
    an end-face electrode connected to the electrically conductive pattern, the end-face electrode being formed on the side face of the alumina board,
    wherein the semiconductor bare chip is wire-bonded to the electrically conductive pattern.

2. An electronic-circuit unit according to claim 1, wherein a Cu layer is formed on a surface of the capacitor and the inductive device.

3. An electronic-circuit unit according to claim 1, wherein the end-face electrode comprises a thick film by formed by the use of a low-temperature baked material.

4. An electronic-circuit unit according to claim 3, wherein an Au plating layer is formed on the end-face electrode.

5. An electronic-circuit unit according to claim 3, further comprising a plurality of end-face electrodes, wherein the surface of the alumina board has a generally rectangular shape bounded by four side faces formed perpendicular to the surface, and the end-face electrodes are each formed as a thick film on only two of the four side faces, the two side faces being disposed along opposite edges of the surface of the alumina board.

6. An electronic-circuit unit according to claim 4, further comprising a plurality of end-face electrodes, wherein the surface of the alumina board has a generally rectangular shape bounded by four side faces formed perpendicular to the surface, and the end-face electrodes are each formed as a thick film on only two of the four side faces, the two side faces being disposed along opposite edges of the surface of the alumina board.

7. An electronic-circuit unit comprising:

circuit element comprising a capacitor, a resistor, and an inductive device, formed as thin films on a surface of an alumina board having a rectangular, plane shape;

a semiconductor bare chip wire-bonded on the surface of the alumina board;

grounding electrodes formed near each of the two opposing side faces of the alumina board, the side faces being perpendicular to the surface of the alumina board; and an input electrode and an output electrode formed along either of the side faces of the alumina board, the input electrode and the output electrode each being formed between the two grounding electrodes formed near each of the side faces, wherein the grounding electrodes, the input electrode and the output electrode each comprise and end face electrode formed on the side faces of the alumina board.

8. An electronic-circuit unit according to claim 7, wherein a shielding cover is mounted to the alumina board so as to cover the circuit elements and the semiconductor bare chip, the shielding cover being soldered to the grounding electrodes.

* * * * *

UNITED STATES PATENT AND TRADEMARK OFFICE
CERTIFICATE OF CORRECTION

PATENT NO.         : 6,700,177 B2
APPLICATION NO. : 09/867919
DATED                 : March 2, 2004
INVENTOR(S)       : Akiyuki Yoshisato et al.

It is certified that error appears in the above-identified patent and that said Letters Patent is hereby corrected as shown below:

In the Claims

Col. 11, line 18 in claim 7, line 4, before "shape;" delete "plane" and substitute --planar-- in its place.

Col. 12, line 1 in claim 7, line 7, after "near" delete "each of the two" and substitute --each end of two-- in its place.

Col. 12, line 11 in claim 7, line 16, after "comprise" delete "and end face" and substitute --an end-face-- in its place.

Signed and Sealed this

Fifth Day of February, 2008

JON W. DUDAS
*Director of the United States Patent and Trademark Office*